United States Patent
Ahn et al.

(10) Patent No.: US 10,770,024 B2
(45) Date of Patent: Sep. 8, 2020

(54) DISPLAY DEVICE HAVING A VOLTAGE GENERATOR

(71) Applicant: SAMSUNG DISPLAY CO., LTD., Yongin-si, Gyeonggi-Do (KR)

(72) Inventors: Gwangsoo Ahn, Suwon-si (KR); Sanghyun Lee, Seongnam-si (KR); Dongwon Park, Asan-si (KR); Songyi Han, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/233,206

(22) Filed: Dec. 27, 2018

(65) Prior Publication Data

US 2019/0206357 A1    Jul. 4, 2019

(30) Foreign Application Priority Data

Dec. 28, 2017 (KR) .......................... 10-2017-0183056

(51) Int. Cl.
| | |
|---|---|
| *G09G 5/00* | (2006.01) |
| *G09G 3/36* | (2006.01) |
| *H03K 5/24* | (2006.01) |
| *G05F 1/575* | (2006.01) |

(52) U.S. Cl.
CPC ........... *G09G 3/3696* (2013.01); *G05F 1/575* (2013.01); *G09G 3/3655* (2013.01); *H03K 5/24* (2013.01); *G09G 2320/0204* (2013.01); *G09G 2330/021* (2013.01)

(58) Field of Classification Search
USPC ................ 345/212, 211, 213, 94, 204, 214; 327/170; 323/273, 280
See application file for complete search history.

(56) References Cited

U.S. PATENT DOCUMENTS

| | | | |
|---|---|---|---|
| 9,330,631 | B2 | 5/2016 | Lee et al. |
| 9,601,077 | B2 | 3/2017 | Lim et al. |

(Continued)

FOREIGN PATENT DOCUMENTS

| | | |
|---|---|---|
| KR | 10-2014-0139679 | 12/2014 |
| KR | 10-2015-0022457 | 3/2015 |

*Primary Examiner* — Thuy N Pardo
(74) *Attorney, Agent, or Firm* — F. Chau & Associates, LLC

(57) ABSTRACT

A display device includes a driving controller sensing a pattern of first image signals from a source external to the driving controller and outputting a compensation selection signal corresponding to the sensed pattern. A voltage generator generates a driving power voltage in response to the compensation selection signal. The voltage generator includes a power converter generating the driving power voltage in response to a power control signal, a comparator comparing the driving power voltage with a reference voltage to output a feedback signal to a first node, and a compensation circuit including a plurality of compensation units. A selected compensation unit is connected to the first node, and a power control circuit outputs the power control signal in response to the feedback signal. The slew rate of the feedback signal may be controlled by a compensation circuit to remove a ripple component from the driving power voltage.

22 Claims, 9 Drawing Sheets

(56) References Cited

U.S. PATENT DOCUMENTS

| | | | |
|---|---|---|---|
| 2002/0030523 A1* | 3/2002 | Muljono | H03K 19/0005 327/170 |
| 2006/0197513 A1* | 9/2006 | Tang | G05F 1/575 323/273 |
| 2009/0128536 A1* | 5/2009 | Seo | G09G 3/3655 345/211 |
| 2010/0033415 A1* | 2/2010 | Bae | G09G 3/3696 345/94 |
| 2011/0141092 A1* | 6/2011 | Kawagoshi | G09G 3/3696 345/211 |
| 2011/0148893 A1* | 6/2011 | An | G09G 3/3614 345/545 |
| 2012/0127138 A1* | 5/2012 | Tsuchi | H03F 1/0261 345/204 |
| 2014/0159682 A1* | 6/2014 | Pan | G05F 1/575 323/280 |
| 2014/0159683 A1* | 6/2014 | Pan | G05F 1/575 323/280 |
| 2015/0154917 A1* | 6/2015 | Jung | G09G 3/342 345/102 |
| 2015/0194115 A1* | 7/2015 | Tsuchi | H03F 1/0261 345/212 |
| 2015/0317943 A1* | 11/2015 | Kawagoshi | G09G 3/3688 345/92 |
| 2016/0070294 A1* | 3/2016 | Chung | G09G 5/12 345/213 |
| 2016/0189662 A1* | 6/2016 | Cho | G09G 3/3655 345/211 |
| 2016/0379581 A1* | 12/2016 | Takenaka | G09G 3/3648 345/212 |

\* cited by examiner

DISPLAY DEVICE HAVING A VOLTAGE GENERATOR

CROSS-REFERENCE TO RELATED APPLICATION

This U.S. non-provisional patent application claims priority under 35 U.S.C. § 119 to Korean Patent Application No. 10-2017-0183056, filed on Dec. 28, 2017, the disclosure of which is incorporated by reference herein in its entirety.

TECHNICAL FIELD

Exemplary embodiments of the inventive concept relate to a display device and the operation of gate drivers and data drivers. More particularly, the exemplary embodiments of the inventive concept relate to a display device having a voltage generator for generating a voltage utilized for an operation of the display device.

DISCUSSION OF THE RELATED ART

A display device includes gate lines, data lines, and pixels connected to the gate lines and the data lines. The display device includes a gate driver for applying gate signals to the gate lines and a data driver for applying data signals to the data lines. The display device further includes a voltage generator for generating driving voltages used to drive the gate driver and the data driver.

When the voltage generator generates stable driving voltages, the gate driven and data driver can be stably driven.

SUMMARY

Exemplary embodiments of the inventive concept provide a display device including a driving controller configured to sense a pattern of first image signals, and output a compensation selection signal corresponding to the sensed pattern; and a voltage generator configured to generate a driving power voltage in response to the compensation selection signal, the voltage generator comprising: a power converter configured to generate the driving power voltage in response to a power control signal; a comparator configured to compare the driving power voltage with a reference voltage to generate a feedback signal and apply the feedback signal to a first node; a compensation circuit comprising a plurality of compensation units, wherein the compensation circuit selects one of the compensation units in response to the compensation selection signal, and connects the selected compensation unit to the first node; and a power control circuit configured to generate the power control signal in response to the feedback signal.

The compensation units may have compensation characteristics that are different from each other.

Each of the compensation units may include a resistor having a first end and a second end, and a capacitor connected between the second end of the resistor and a ground voltage.

The resistors of the compensation units may have different resistance values from each other, and the capacitors of the compensation units may have different capacitances from each other.

The compensation circuit further includes a switching circuit connected between the first end of the resistor of each of the respective compensation units and the first node and operated in response to the compensation selection signal.

When the pattern of the first image signals is a first pattern with a current consumption of a first level, the driving controller outputs the compensation selection signal to connect a first resistor having a largest resistance value among the resistors to the first node.

When the pattern of the first image signals is a second pattern with a current consumption smaller than the first level, the driving controller outputs the compensation selection signal to connect a second resistor having a resistance value smaller than the first resistor to the first node.

When the pattern of the first image signals is a first pattern in which an amount of current consumption is large, the driving controller outputs the compensation selection signal to the first end of a selected first resistor among the first resistors of the compensation circuits that has the largest resistance value to connect the selected first resistor to the first node.

When the pattern of the first image signals is a second pattern in which the current consumption is smaller than the current consumption of the first pattern, the driving controller outputs the compensation selection signal such that the one end of a second resistor having the resistance value smaller than the first resistor among the resistors of the compensation circuits is connected to the first node.

The compensation units includes a first compensation unit and a second compensation unit, the first compensation unit includes a first resistor having a first resistance value and a first capacitor having a first capacitance and connected to the first resistor in series, and the second compensation unit includes a second resistor having a second resistance value larger than the first resistance value and a second capacitor having a second capacitance smaller than the first capacitance and connected to the second resistor in series.

The driving controller outputs the compensation selection signal to select the first compensation unit when the pattern of the first image signals is a first pattern and outputs the compensation selection signal to select the second compensation unit when the pattern of the first image signals is a second pattern having a current consumption larger than the first pattern.

The display device may further includes a display panel including a plurality of gate lines, a plurality of data lines, and a plurality of pixels connected to the gate lines and the data lines, a gate driver driving the gate lines, and a data driver receiving the driving power voltage and driving the data lines.

Exemplary embodiments of the inventive concept provide a display device including a driving controller configured to sense a pattern of first image signals applied to the driving controller and generate a compensation selection signal corresponding to the sensed pattern; a voltage generator configured to generate a driving power voltage; and a compensation circuit comprising a plurality of compensation units, wherein the compensation circuit is configured to electrically connect one compensation unit among the compensation units to a first node of the voltage generator in response to the compensation selection signal, the voltage generator comprising: a power converter generating the driving power voltage in response to a power control signal, a comparator comparing the driving power voltage with a reference voltage to output a feedback signal to the first node, and a power control circuit that outputs the power control signal in response to the feedback signal.

Each of the compensation units includes a resistor having a first end and a second end, and a capacitor connected between the second end of the resistor and a ground voltage.

The resistors of the compensation units may have different resistance values from each other, and the capacitors of the compensation units may have different capacitances from each other.

The compensation circuit may further include a switching circuit connected between the first end of the resistor of each of the compensation units and the first node and operated in response to the compensation selection signal.

When the pattern of the first image signals is a first pattern with a current consumption of a first level, the driving controller outputs the compensation selection signal to connect a first resistor having a largest resistance value among the resistors to the first node.

When the pattern of the first image signals is a second pattern with a current consumption is smaller than the first level, the driving controller outputs the compensation selection signal to connect a second resistor having a resistance value smaller than the first resistor to the first node.

The compensation units may include a first compensation unit and a second compensation unit, the first compensation unit includes a first resistor having a first resistance value and a first capacitor having a first capacitance and connected to the first resistor in series, and the second compensation unit includes a second resistor having a second resistance value larger than the first resistance value and a second capacitor having a second capacitance smaller than the first capacitance and connected to the second resistor in series.

The driving controller selects the first compensation unit when the pattern of the first image signals is a first pattern.

When the pattern of the first image signals is a second pattern having a current consumption larger than the first pattern, the driving controller outputs the compensation selection signal to select the second compensation unit.

The display device further includes a display panel including a plurality of gate lines, a plurality of data lines, and a plurality of pixels connected to the gate lines and the data lines, a gate driver driving the gate lines, and a data driver receiving the driving power voltage and driving the data lines.

The voltage generator may output the power control signal in response to the feedback signal to generate the driving power voltage during an active period of a frame.

Exemplary embodiments of the inventive concept provide a display device including a driving controller configured to sense a pattern of image signals and output a compensation selection signal corresponding to the sensed pattern; and a voltage generator configured to generate a driving power voltage in response to the compensation selection signal, wherein the voltage generator is further configured to generate the driving power voltage in response to a feedback signal having a slew rate controlled by a compensation circuit selected by the compensation signal.

A ripple component of the driving power voltage is removed by a power control circuit that generates a power control signal in response to the feedback signal.

BRIEF DESCRIPTION OF THE DRAWINGS

The above and other features of the inventive concept will become apparent by describing in detail exemplary embodiments thereof with reference to the accompanying drawings, in which.

DETAILED DESCRIPTION

Hereinafter, exemplary embodiments of the inventive concept will be described in detail with reference to the accompanying drawings. The inventive concept may, however, be embodied in different forms and should not be construed as being limited to the embodiments set forth herein.

The terminology used herein is for the purpose of describing particular embodiments only and is not intended to be limiting of the inventive concept. As used herein, the singular forms, "a", "an" and "the" are intended to include the plural forms as well, unless the context clearly indicates otherwise.

Figure 1:
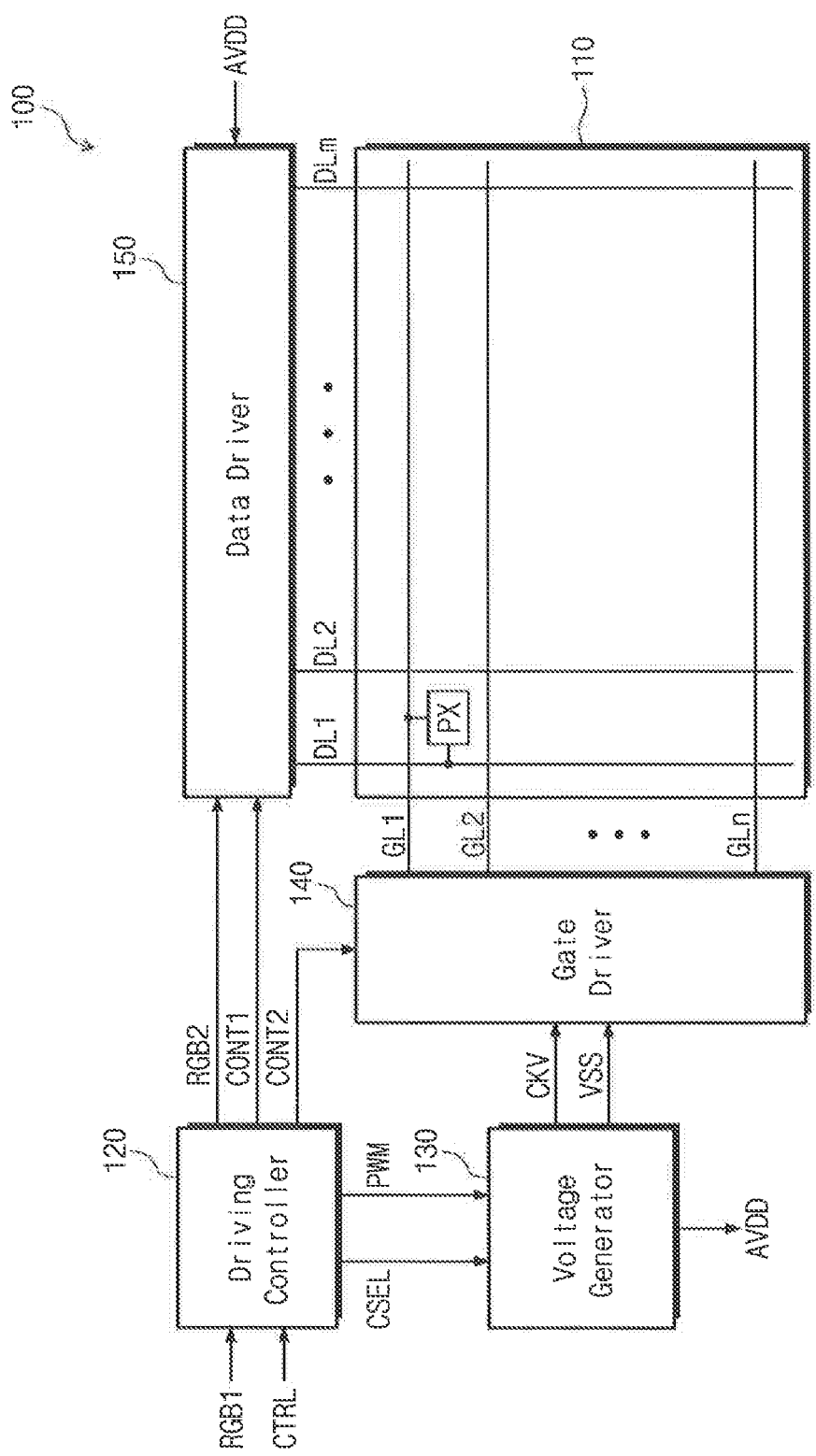
FIG. 1 is a block diagram showing a configuration of a display device according to an exemplary embodiment of the inventive concept.

FIG. 1 is a block diagram showing a configuration of a display device 100 according to an exemplary embodiment of the inventive concept.

Referring to FIG. 1, the display device 100 includes a display panel 110, a driving controller 120, a voltage generator 130, a gate driver 140, and a data driver 150.

The display panel 110 includes a plurality of data lines DL1 to DLm, a plurality of gate lines GL1 to GLn arranged to cross the data lines DL1 to DLm, and a plurality of pixels PX arranged in areas border by the data lines DL1 to DLm and the gate lines GL1 to GLn crossing the data lines DL1 to DLm. The data lines DL1 to DLm are insulated from the gate lines GL1 to GLn.

Each pixel PX may include a switching transistor connected to a corresponding data line among the data lines DL1 to DLm and a corresponding gate line among the gate lines GL1 to GLn, a liquid crystal capacitor connected to the switching transistor, and a storage capacitor connected to the switching transistor.

In a case where the display device 100 is an organic light emitting display device, each pixel PX may include an organic light emitting diode and switching transistors to drive the organic light emitting diode.

The driving controller 120 receives first image signals RGB1 and control signals CTRL, (e.g., a vertical synchronization signal, a horizontal synchronization signal, a main clock signal, a data enable signal, etc.) to control a display of the first image signals RGB1 from an external source. The driving controller 120 applies second image signals RGB2, which are obtained by processing the first image signals RGB1 in consideration of an operating condition of the display panel 110 based on the control signals CTRL, and a first control signal CONT1 to the data driver 150. The driving controller 120 applies a second control signal CONT2 to the gate driver 140. The first control signal CONT1 includes a clock signal, a polarity inversion signal, and a line latch signal. The second control signal CONT2 includes a vertical synchronization start signal, an output enable signal, and a gate pulse signal.

The driving controller 120 applies a pulse width control signal PWM and a compensation selection signal CSEL to the voltage generator 130. In the present exemplary embodiment, the driving controller 120 determines a pattern of the first image signals RGB1, and output the compensation selection signal CSEL corresponding to the determined pattern.

The voltage generator 130 generates a plurality of voltages and clock signals utilized for the operation of the display panel 110. In the present exemplary embodiment, the voltage generator 130 applies a gate clock signal CKV and a ground voltage VSS to the gate driver 140. In addition, the voltage generator 130 further generates a driving voltage AVDD utilized for the operation of the data driver 150.

In the present exemplary embodiment, the voltage generator 130 generates the driving voltage AVDD in response to the pulse width control signal PWM. In addition, the voltage generator 130 selects a compensation value in response to the compensation selection signal CSEL while removing a ripple component of the driving voltage AVDD, thereby effectively removing the ripple component.

In the present exemplary embodiment, the voltage generator 130 is described with regard to removal of the ripple component from the driving voltage AVDD applied to the data driver 150. For example, as will be discussed later, a compensation circuit may be used to remove the ripple component from a driving voltage by controlling the slew rate of a feedback signal. It is to be understood, however that the voltage generator 130 may farther include a function to remove a ripple component from other voltages, e.g., a common voltage, a gate-on voltage, a backlight driving voltage, etc.

The gate driver 140 drives the gate lines GL1 to GLn in response to the second control signal CONT2 from the driving controller 120, the gate clock signal CKV from the voltage generator 130, and the ground voltage VSS from the voltage generator 130. The gate driver 140 includes a gate driving integrated circuit (IC). The gate driver 140 may be implemented in a circuit with an amorphous silicon gate (ASG) using an amorphous silicon thin-film transistor (a-Si TFT), an oxide semiconductor, a crystalline semiconductor, a polycrystalline semiconductor, or the like in addition to the gate driving IC. The gate driver 140 may be substantially simultaneously formed with the pixels PX through a thin-film process. In this ease, the gate driver 140 may be disposed in a predetermined area (e.g., a non-display area) of one side of the display panel 110.

With continued reference to FIG. 1, the data driver 150 receives the driving voltage AVDD from the voltage generator 130 and drives the data lines DL1 to DLm in response to the second image signals RGB2 and the first control signal CONT1 provided from the driving controller 120.

While one gate line is driven at a gate-on voltage having a predetermined level by the gate driver 140, the switching transistors of the pixels PX arranged in one row and connected to the one gate line are turned on. In this case, the data driver 150 applies grayscale voltages corresponding to the second image signals RGB2 to the data lines DL1 to DLm. The grayscale voltages applied to the data lines DL1 to DLm are applied to corresponding liquid crystal capacitors and corresponding storage capacitors through the turned-on switching transistors.

Figure 2:
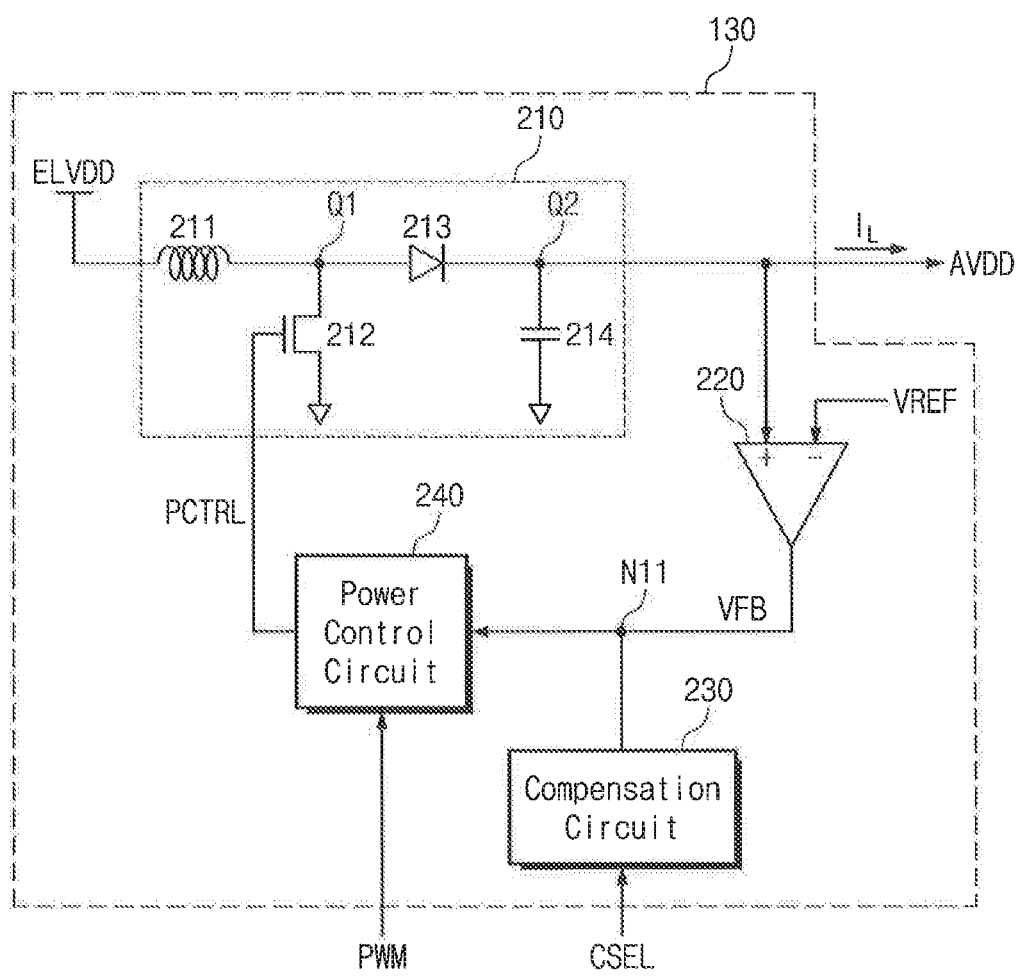
FIG. 2 is a circuit diagram showing a circuit configuration of a voltage generator according to an exemplary embodiment of the inventive concept.

FIG. 2 is a circuit diagram showing a circuit configuration of the voltage generator 130 of FIG. 1 according to an exemplary embodiment of the inventive concept.

Referring to FIG. 2, the voltage generator 130 includes a power converter 210, a comparator 220, a compensation circuit 230, and a power control circuit 240.

The power converter 210 converts a power voltage ELVDD provided from an external source to the driving voltage AVDD. The voltage level of the driving voltage AVDD may be set to a level utilized for the operation of the data driver 150 (refer to FIG. 1) and may be maintained at a stable level.

The power converter 210 may be one of various DC-to-DC converters, e.g., a buck-boost type DC-to-DC converter, a boost type DC-to-DC, converter, a high-bridge type DC-to-DC converter, etc.

In the present exemplary embodiment, the power converter 210 includes an inductor 211, a transistor 212, a diode 213, and a capacitor 214. The inductor 211 is connected between the power voltage ELVDD provided from the external source and a node Q1. The transistor 212 includes a first electrode connected to the node Q1, a second electrode connected to a ground terminal, and a control electrode connected to a power control signal PCTRL from the power control circuit 240. In the present exemplary embodiment, the transistor 212 may be a metal-oxide-semiconductor field effected transistor (MOSFET). The diode 213 is connected between the node Q1 and a node Q2. In the present exemplary embodiment, the diode 213 may be a Schottky diode. The capacitor 214 is connected between the node Q2 and the ground terminal. A voltage of the node Q2 is output as the driving voltage AVDD.

The transistor 212 is turned on or off in response to the power control signal PCTRL applied to a gate of the transistor 212 of the power converter 210, and thus a voltage level of the driving voltage AVDD may be controlled.

The comparator 220 compares the driving voltage AVDD with a reference voltage VREF and outputs a feedback signal VFB to a first node N11. In the present exemplary embodiment, the driving voltage AVDD is input to a non-inverting terminal (+) of the comparator 220 and the reference voltage VREF is input to an inverting terminal (−) of the comparator 220.

The power control circuit 240 outputs the power control signal PCTRL in response to the pulse width control signal PWM and the feedback signal VFB.

The compensation circuit 230 is connected to the first node N11. The compensation circuit 230 controls a slew rate of the feedback signal VFB of the first node N11 in response to the compensation selection signal CSEL The voltage generator 130 further includes a memory to store the compensation selection signal CSEL. For example, the memory stores the compensation selection signals CSEL that are provided from the driving controller 120.

Figure 3:
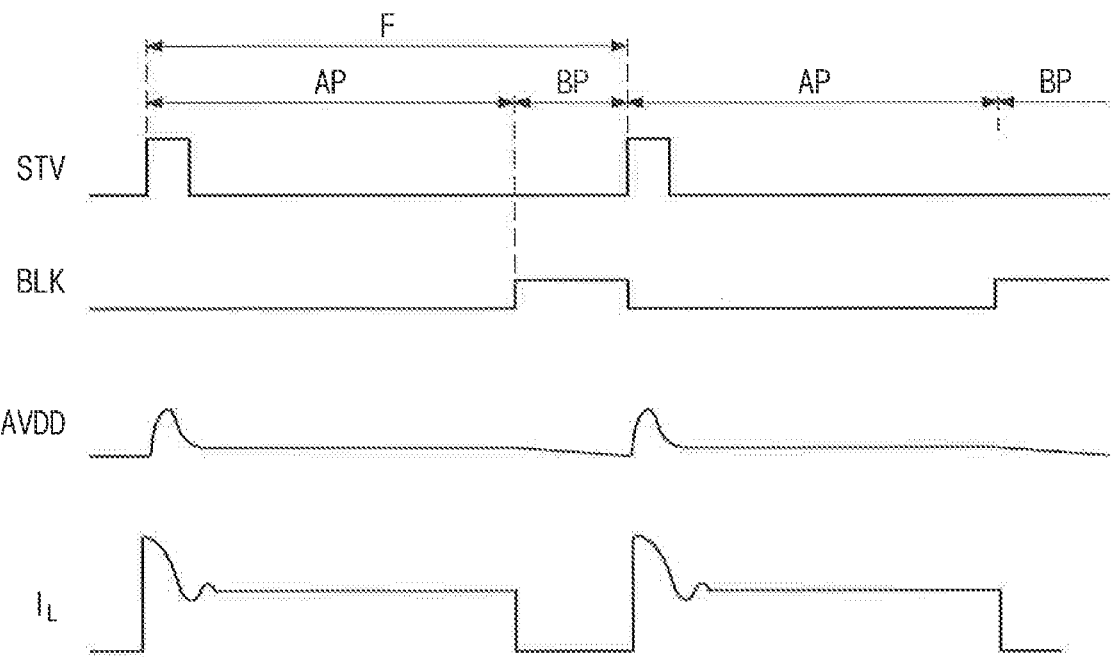
FIG. 3 is a view showing a variation of a driving voltage in the related art when a display device is being operated.

FIG. 3 is a view showing a variation of a driving voltage versus time when a display device is operated according to the related art.

Referring to FIGS. 2 and 3, a vertical start signal STV (included in the second control signal CONT2) applied to the gate driver 140 from the driving controller 120 (refer to FIG. 1) is activated at a start time point of one frame. A blank signal BLK used in the driving controller 120 indicates a blank period in one frame F. The one frame F includes an active period AP and the blank period BP. During the active period AP, the gate driver 140 sequentially drives the gate lines GL1 to GLn, and the data driver 150 drives the data lines DL1 to DLm in response to the second image signals RGB2 and the first control signal CONT1. During the active period AP, the voltage generator 130 outputs the power control signal PCTRL in response to the feedback signal VFB to generate the driving voltage AVDD having a stable voltage level.

During the blank period BP the gate driver 140 and the data driver 150 are not operated and the pulse width control signal PWM maintains a low level. Since the gate driver 140 and the data driver 150 are not being operated, there is little load current $I_L$ during the blank period BP. Further, since the pulse width control signal. PWM maintains a low level during the blank period BP, the voltage level of the driving voltage AVDD gradually decreases. For example, in the first period BP of FIG. 3, the slope of the driving voltage AVDD gradually declines.

When the blank period BP is converted to the active period AP, the pulse width control signal PWM is transited to a high level from the low level. Accordingly, the driving voltage AVDD increases. For example, immediately after the first blank period BP of FIG. 3, the driving voltage AVDD increases. In other words, the driving voltage AVDD has a ripple component. In addition, since the data driver 150 is transited to an operational state from a non-operational state, the load current L is greatly changed.

The ripple component of the driving voltage AVDD may exert an influence on the operation of the data driver 150 during the transitional period to the operational state from the non-operational state. This can cause the quality of an image displayed on the display panel 110 to be degraded.

The voltage generator 130 includes the compensation circuit 230 and controls a response speed of the feedback signal VFB. However, an amount of the load current IL changes depending on the pattern of the first image signals RGB1 provided from the external source. In the present exemplary embodiment, the driving controller 120 shown in FIG. 1 outputs the compensation selection signal CSEL in response to the pattern of the first image signals RGB1. The compensation circuit 230 selects the compensation value in response to the compensation selection signal CSEL, and thus, the ripple may be removed.

Figure 4:
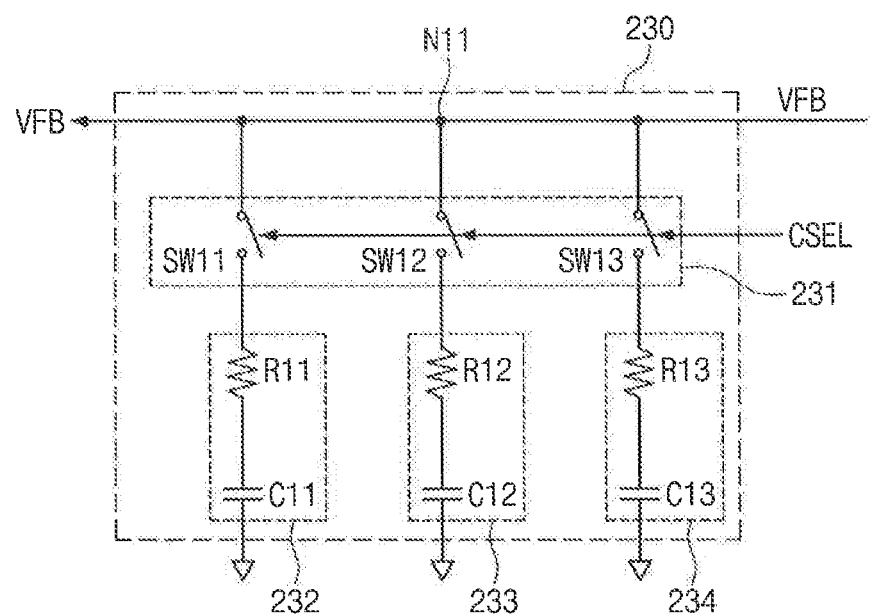
FIG. 4 is a circuit diagram showing a configuration of a compensation circuit according to an exemplary embodiment of the inventive concept.

FIG. 4 is a circuit diagram showing a circuit configuration of the compensation circuit 230 according to an exemplary embodiment of the inventive concept.

Referring to FIG. 4, the compensation circuit 230 includes a switching circuit 231, a first compensation unit 232, a second compensation unit 233, and a third compensation unit 234. Each of the first, second, and third compensation units 232, 233, and 234 includes a resistor and a capacitor.

The first compensation unit 232 includes a resistor R11 having a first end and a second end, and a capacitor C11 connected between the second end of the resistor R11 and a ground voltage. The second compensation unit 233 includes a resistor R12 having a first end and the second end, and a capacitor C12 connected between the second end of the resistor 112 and the ground voltage. The third compensation unit 234 includes a resistor R13 having a first end and a second end, and a capacitor C13 connected between the second end of the resistor 113 and the ground voltage.

The resistors R11, R12, and R13 have different resistance values from each other, and the capacitors C11, C12, and C13 have different capacitances from each other. Accordingly, the first, second, and third compensation units 232, 233, and 234 have different compensation characteristics from each other. The slew rate of the feedback signal VFB is determined by the compensation characteristics of the first, second, and third compensation units 232, 233, and 234.

The switching circuit 231 includes switching devices SW11, SW12, and SW13 respectively corresponding to the first, second, and third compensation units 232, 233, and 234. The switching devices SW11, SW12, and SW13 are operated in response to the compensation selection signal CSEL. The switching device SW11 is connected between the first node N11 and the resistor R11. The switching device SW12 is connected between the first node N11 and the resistor R12. The switching device SW13 is connected between the first node N11 and the resistor 113. The switch device SW11 may be connected in series to the first compensation unit 232. The switch device SW12 may be connected in series to the second compensation unit 233. The switch device SW13 may be connected in series to the third compensation unit 234.

As an example, the compensation selection signal CSEL may be a 2-bit signal. In the present exemplary embodiment, the switching device SW11 is turned on when the compensation selection signal CSEL is '00', the switching device SW12 is turned on when the compensation selection signal CSEL is '01', and the switching device SW13 is turned on when the compensation selection signal CSEL is '10'. In other words, the compensation selection signal CSEL may select one of the resistance-capacitive (RC) combinations by turning on the respective switch of the switching devices SW11, SW12, and SW13.

In the present exemplary embodiment, the resistance values of the resistors R11, R12, and R12 are in the order of R11<R12<R13. In addition, the capacitances of the capacitors C11, C12, and C13 are in the order of C11>C12>C13. In other words, the response speed of the feedback signal VFB output from the comparator 220 is faster when the first compensation unit 232 is connected to the first node N11 through the switching device SW11 than when the second and third compensation units 233 and 234 are connected to the first node N11. In addition, the response speed of the feedback signal VFB output from the comparator 220 is slower when the third compensation unit 232 is connected to the first node N11 through the switching device SW13 than when the first and second compensation units 232 and 233 are connected to the first node N11.

The driving controller 120 shown in FIG. 1 analyzes the pattern of the first image signals RGB1. The driving controller 120 predicts a current consumption (e.g., a size of a load) of the first image signals RGB1 and classifies the pattern depending on the predicted current consumption. As an example, in a case where a brightness of the first image signals RGB1 is high, or a variation in grayscale level is great, e.g., a horizontal stripe, the driving controller 120 may classify the first image signals RGB1 as the pattern having a large current consumption. When the first image signals RGB1 are identified as having the pattern with the large current consumption, the driving controller 120 outputs the compensation selection signal CSEL (e.g., '10') to select the third compensation unit 234. When the first image signals RGB1 have a pattern with an intermediate level of current consumption, the driving controller 120 outputs the compensation selection signal CSEL ('01') to select the second compensation unit 233. When the first image signals RGB1 have a pattern with a small current consumption, the driving controller 120 outputs the compensation selection signal CSEL, (e.g., '00') to select the first compensation unit 232. There may be reference values that the analyzed pattern of the first image signals RGB1 are compared with to classify the predicted current consumption as small, intermediate, or large.

Referring to FIG. 3 again, as the size of the load becomes larger when the blank period BP is changed to the active period AP, a rising width (e.g., the ripple) of the driving voltage AVDD may become abnormally large.

As an example, when the first image signals RGB1 have the pattern with the large current consumption, the driving controller 120 outputs the compensation selection signal CSEL, (e.g., '10') to select the third compensation unit 234. When the driving voltage AVDD increases and becomes higher than the reference voltage VREF, the feedback signal VFB is transited to the high level from the low level. In this case, when the third compensation unit 234 is connected to the first node N11 by the switching circuit 231, the slew rate in which the feedback signal VFB is transited to the high level from the low level becomes slower. In other words, a low-level period of the feedback signal VFB becomes longer. Since the power control circuit 240 outputs the power control signal PCTRL having the low level in response to the feedback signal VFB having the low level, the voltage level of the driving voltage AVDD becomes lower. In this case, when the feedback signal VFB delayed by the third compensation unit 234 is transited to the high level, the power control circuit 240 outputs the power control signal PCTRL, in response to the pulse width control signal PWM, and thus, the power converter 210 may generate the driving voltage AVDD at a desired level.

As another example, when the first image signals RGB1 have the pattern with the small current consumption, the driving controller 120 outputs the compensation selection signal CSEL (e.g., '00') to select the first compensation unit 232. When the driving voltage AVDD increases and becomes higher than the reference voltage VREF, the feedback signal VFB is transited to the high level from the low level. In this case, when the first compensation unit 232 is connected to the first node N11 by the switching circuit 231, the slew rate in which the feedback signal VFB is transited to the high level from the low level becomes faster. When the feedback signal VFB is transited to the high level from the low level, the power control circuit 240 outputs the power control signal PCTRL having the high level. In this case, the power control circuit 240 outputs the power control signal PCTRL, in response to the pulse width control signal PWM, and thus, the power converter 210 may generate the driving voltage AVDD at a desired level.

Figure 5:
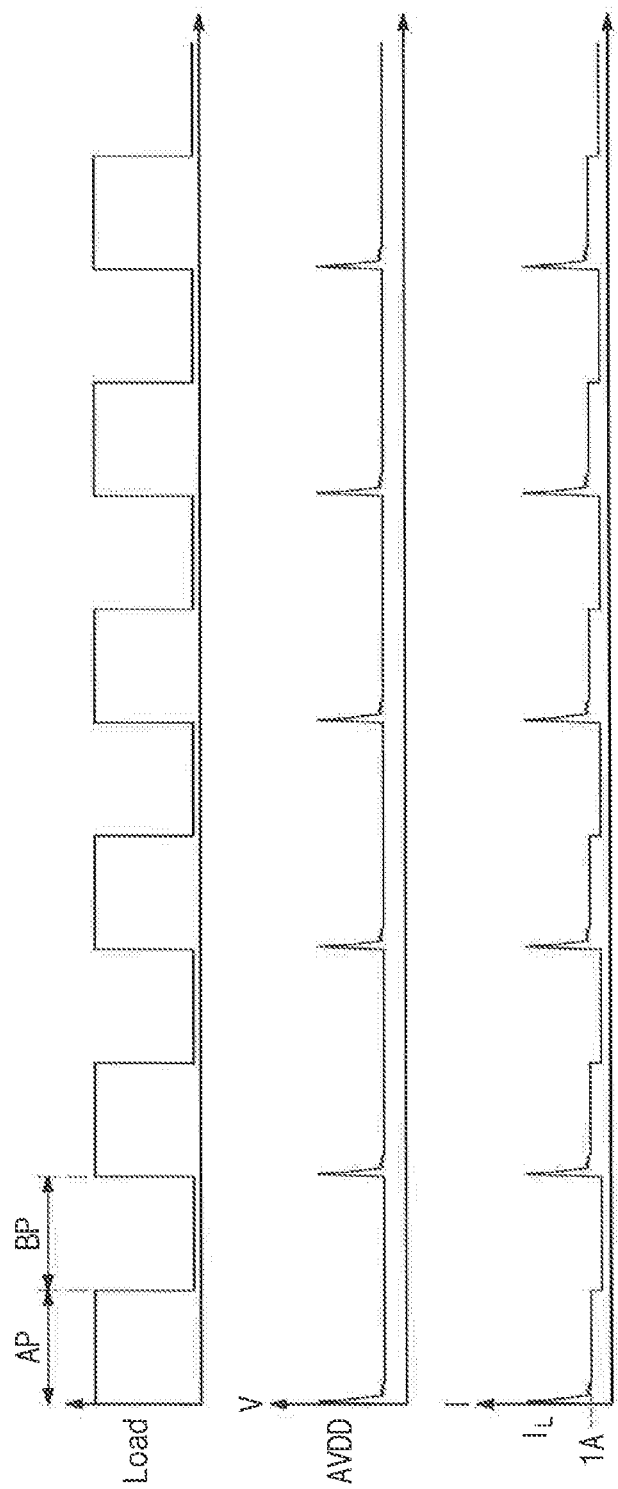
FIG. 5 is a view showing a variation of a driving voltage and a load current when a third compensation unit shown in FIG. 4 is connected to a first node and a load current of about 1 A is consumed during an active period in accordance with an exemplary embodiment of the inventive concept.

FIG. 5 is a view showing a variation of the driving voltage AVDD and the load current $I_L$ when the first compensation unit 232 shown in FIG. 4 is connected to the first node N11 and the load current $I_L$ of about 1 A is consumed during the active period AP.

Figure 6:
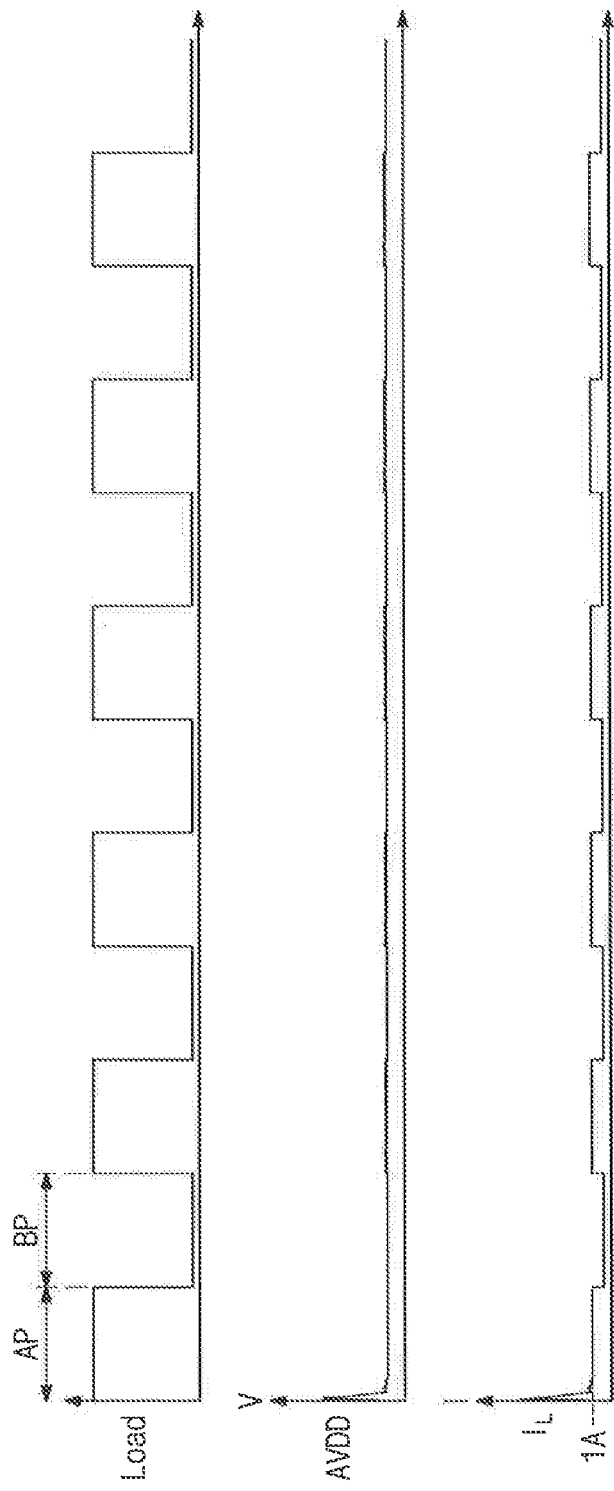
FIG. 6 is a view showing a variation of the driving voltage and the load current when a first compensation unit shown in FIG. 4 is connected to the first node and the load current of about 1 A is consumed during the active period in accordance with an exemplary embodiment of the inventive concept.

FIG. 6 is a view showing a variation of the driving voltage AVDD and the load current $I_L$ when the third compensation unit 234 shown in FIG. 4 is connected to the first node N11 and the load current $I_L$ of about 1 A is consumed during the active period AP in accordance with an exemplary embodiment of the inventive concept.

As shown in FIG. 5, when the relatively-large load current $I_L$ of about 1 A flows in the active period AP and the first compensation unit 232 including the resistor R11 having a small resistance value (e.g., about 1 KΩ) and the capacitor C11 having a large capacitance (e.g., about 1 nF) is connected to the first node N11, the ripple included in the driving voltage AVDD increases, as can be seen by the voltage spike in the driving voltage at the start of each active period AP shown in FIG. 5.

As shown in FIG. 6, when the relatively-large load current $I_L$ of about 1 A flows in the active period AP and the third compensation unit 234 including the resistor R13 having a large resistance value (e.g., about 100 KΩ) and the capacitor C13 having small capacitance (e.g., about 200 pF) is connected to the first node N11, the ripple included in the driving voltage AVDD decreases, as shown by the relatively flat driving voltage AVDD at the beginning of each active period has a little or no ripple (as compared with the voltage spikes in FIG. 5).

Figure 7:
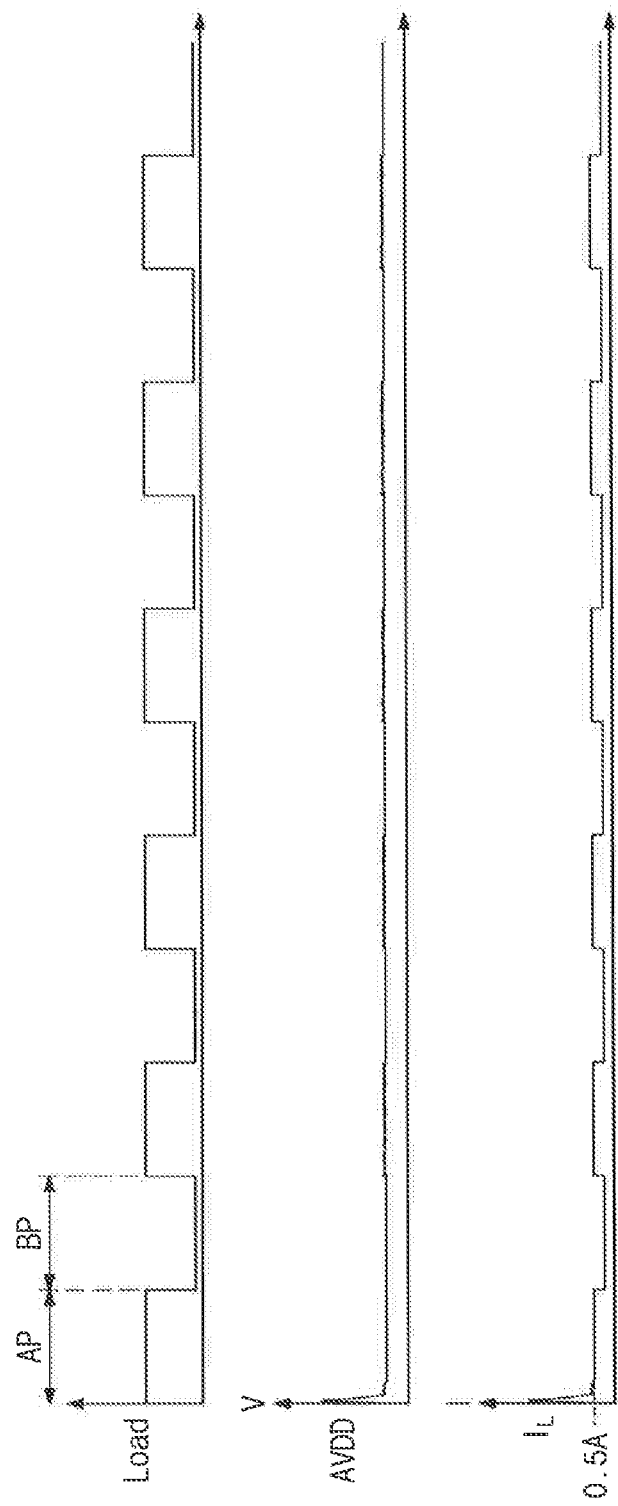
FIG. 7 is a view showing a variation of the driving voltage and the load current when the third compensation unit shown in FIG. 4 is connected to the first node and a load current of about 0.5 A is consumed during the active period in accordance with an exemplary embodiment of the inventive concept.

FIG. 7 is a view showing a variation of the driving voltage AVDD and the load current $I_L$ when the first compensation unit 232 shown in FIG. 4 is connected to the first node N11 and the load current $I_L$, of about 0.5 A is consumed during the active period AP in accordance with an exemplary embodiment of the inventive concept.

Figure 8:
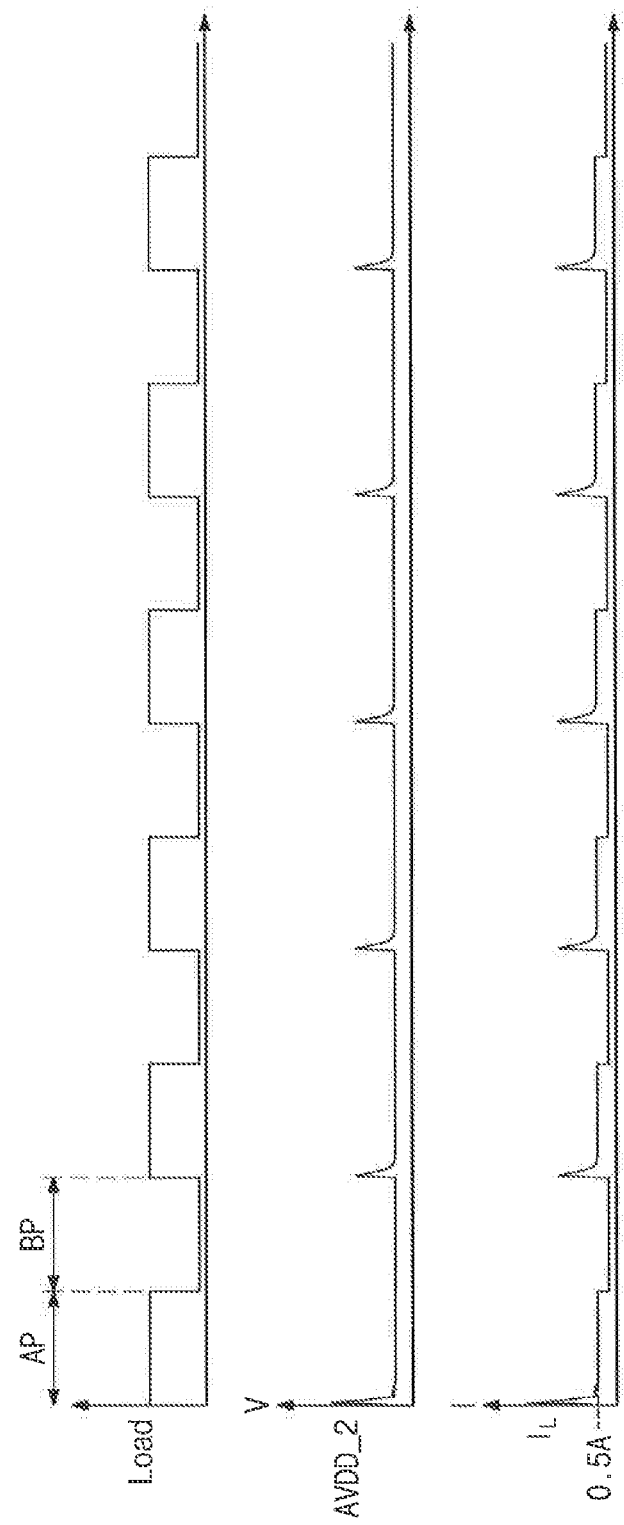
FIG. 8 is a view showing a variation of the driving voltage and the load current when the first compensation unit shown in FIG. 4 is connected to the first node and the load current of about 0.5 A is consumed during the active period in accordance with an exemplary embodiment of the inventive concept.

FIG. 8 is a view showing a variation of the driving voltage AVDD and the load current $I_L$, when the third compensation unit 234 shown in FIG. 4 is connected to the first node N11 and the load current $I_L$ of about 0.5 A is consumed during the active period AP in accordance with an exemplary embodiment of the inventive concept.

As shown in FIG. 7, when the relatively-small load current of about 0.5 A flows in the active period AP and the first compensation unit 232 including the resistor R11 having a small resistance value (e.g., about 1 KΩ) and the capacitor C11 having a large capacitance (e.g., about 1 nF) is connected to the first node N11, the ripple included in the driving voltage AVDD decreases as shown by the relatively flat driving voltage AVDD at the beginning of each active period has a little or no ripple (as compared with the voltage spikes in FIG. 5).

As shown in FIG. 8, when the relatively-small load current $I_L$ of about 0.5 A flows in the active period AP and the third compensation unit 234 including the resistor R13 having a large resistance value (e.g., about 100 KΩ) and the capacitor C13 having a small capacitance (e.g., about 200 pF) is connected to the first node N11, the ripple included in the driving voltage AVDD increases.

In other words, the driving controller 120 outputs the compensation selection signal CSEL depending on the size of the load of the first image signals RGB1, and the voltage generator 130 connects one of the first, second, and third compensation units 232, 233, and 234 to the first node N11 in response to the compensation selection signal CSEL. Accordingly, the ripple in the driving voltage AVDD may be minimized.

Figure 9:
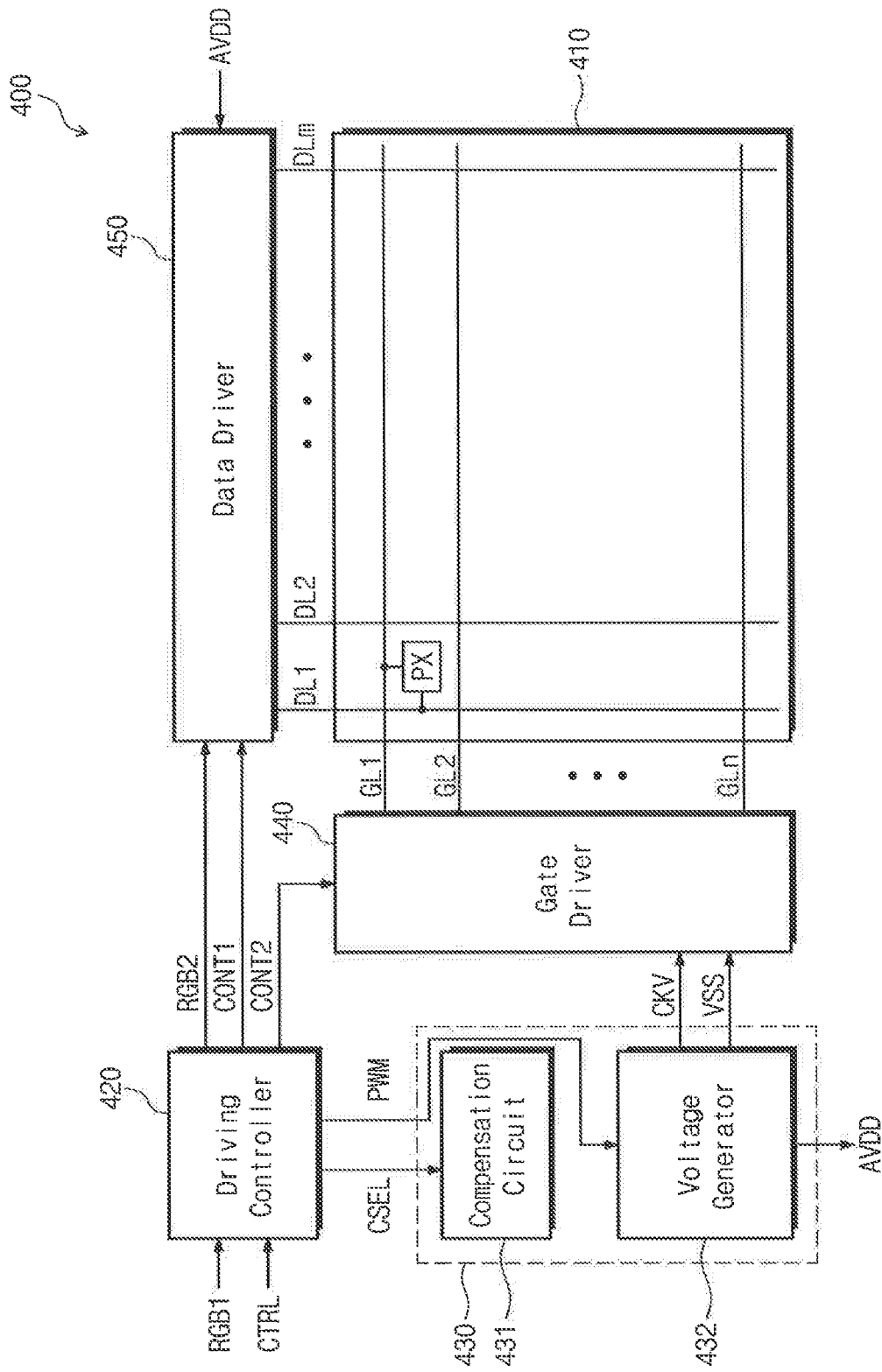
FIG. 9 is a block diagram showing a configuration of a display device according to an exemplary embodiment of the inventive concept.

FIG. 9 is a block diagram showing a configuration of a display device 400 according to another exemplary embodiment of the inventive concept.

Referring to FIG. 9, the display device 400 includes a display panel 410, a driving controller 420, a voltage generating circuit 430, a gate driver 440, and a data driver 450. Since the display panel 410, the driving controller 420, the gate driver 440, and the data driver 450 shown in FIG. 9 have the same structure and function as those of the display panel 110, the driving controller 120, the gate driver 140, and the data driver 150 shown in FIG. 1. Therefore, details regarding the display device 400 will be omitted.

The voltage generating circuit 430 includes a compensation circuit 431 and a voltage generator 432. The voltage generator 432 may include a single integrated circuit, e.g., a power management integrated circuit (PMIC).

The compensation circuit 431 selects one compensation unit from among a plurality of compensation units having different compensation characteristics in response to a compensation selection signal CSEL, from the driving controller 420 and connects the selected compensation unit to the voltage generator 432.

The voltage generator 432 generates a plurality of voltages and clock signals utilized for the operation of the display panel 410. In the present embodiment, the voltage generator 432 applies a gate clock signal CKV and a ground voltage VSS to the gate driver 440. In addition, the voltage generator 432 further generates a driving voltage AVDD utilized for the operation of the data driver 450. In addition, the voltage generator 432 generates the driving voltage AVDD in response to a pulse width control signal PWM.

Figure 10:
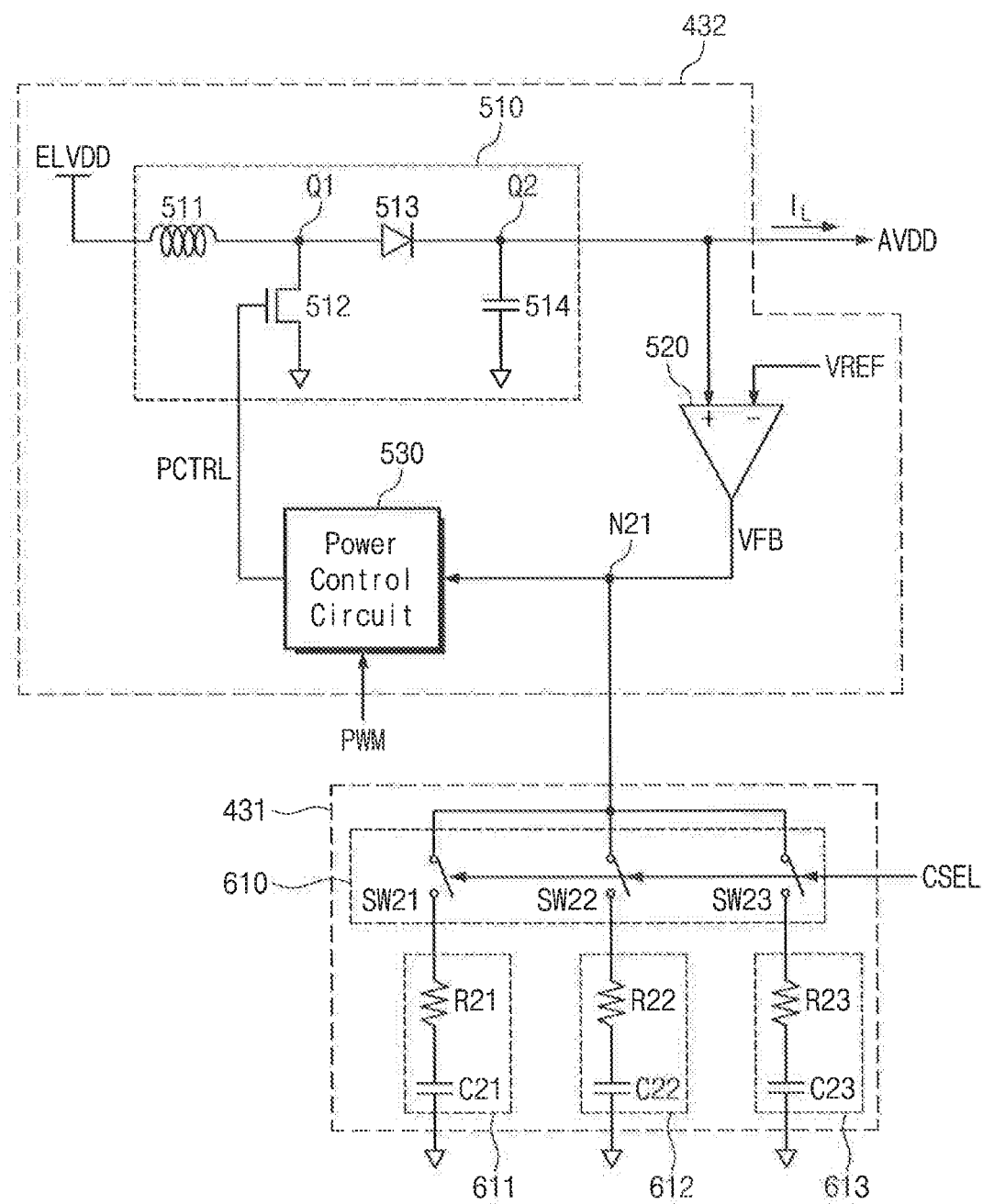
FIG. 10 is a circuit diagram showing a circuit configuration of a voltage generator and a compensation circuit according to an exemplary embodiment of the inventive concept.

FIG. 10 is a circuit diagram showing a circuit configuration of the voltage generator 432 and the compensation circuit 431 according to an embodiment of the inventive concept. Referring to FIG. 10, the voltage generator 432 includes a power converter 510, a comparator 520, and a power control circuit 530.

The power converter 510 converts a power voltage ELVDD provided from an external source (not shown) to the driving voltage AVDD. The voltage level of the driving voltage AVDD may be set to a level utilized for the operation of the data driver 450 (refer to FIG. 9) and maintained in a stable level.

A transistor 512 is turned on or off in response to a power control signal PCTRL applied to a gate of the transistor 512 of the power converter 510, and thus a voltage level of a light source power voltage VLED may be controlled.

The comparator 520 compares the driving voltage AVDD with a reference voltage VREF and outputs a feedback signal VFB to a first node N21. In the present embodiment, the driving voltage AVDD is input to a non-inverting terminal (+) of the comparator 520 and the reference voltage VREF is input to an inverting terminal (−) of the comparator 520.

The power control circuit 530 outputs the power control signal PCTRL in response to the pulse width control signal PWM and the feedback signal VFB.

The compensation circuit 431 is connected to the first node N21 of the voltage generator 432. The compensation circuit 431 controls a slew rate of the feedback signal VFB of the first node N21 in response to the compensation selection signal CSEL.

The compensation circuit 431 includes a switching circuit 610 and a first compensation unit 611, a second compensation unit 612, and a third compensation unit 613. Each of the first, second, and third compensation units 611, 612, and 613 includes a resistor and a capacitor. The first compensation unit 611 includes a resistor R21 having a first end and a second end, and a capacitor C21 connected between the second end of the resistor R21 and a ground voltage. The second compensation unit 612 includes a resistor R22 having a first end and a second end, and a capacitor C22 connected between the second end of the resistor R22 and the ground voltage. The third compensation unit 613 includes a resistor R23 having a first end and a second end, and a capacitor C23 connected between the second end of the resistor R23 and the ground voltage.

The resistors R21, R22, and R23 have different resistance values from each other, and the capacitors C21, C22, and C23 have different capacitances from each other. Accordingly, the first, second, and third compensation units 611, 612, and 613 have different compensation characteristics from each other. The slew rate of the feedback signal VFB is determined by the compensation characteristics of the first, second, and third compensation units 611, 612, and 613.

Accordingly, the display device may include a plurality of compensation units. When there is a plurality of compensation units, the driving controller of the display device connects one compensation unit from among the compensation units to the first node of the voltage generator according to the pattern of input image signals. Thus, the ripple in the driving voltage may be effectively removed depending on the size of the load of the input image signals.

Although the inventive concept has been shown and described in reference to exemplary embodiments thereof, it is understood by those of ordinary skill in the art that various changes in form and detail can be made thereto without departing from the spirit and scope of the inventive concept as claimed.

What is claimed is:

1. A display device comprising:
    a driving controller configured to sense a pattern of first image signals, and output a compensation selection signal corresponding to the sensed pattern; and
    a voltage generator configured to generate a driving power voltage in response to a feedback signal having a slew rate based on the compensation selection signal, the voltage generator comprising:
        a power converter configured to generate the driving power voltage in response to a power control signal;
        a comparator configured to compare the driving power voltage with a reference voltage to generate a feedback signal and apply the feedback signal to a first node;
        a compensation circuit comprising a plurality of compensation units, wherein the compensation circuit selects one of the compensation units in response to the compensation selection signal, and connects the selected compensation unit to the first node; and
        a power control circuit configured to generate the power control signal in response to the feedback signal.

2. The display device of claim 1, wherein the compensation units have different compensation characteristics from each other.

3. The display device of claim 1, wherein each of the compensation units comprises:
    a resistor comprising a first end and a second end; and
    a capacitor connected between the second end of the resistor and a ground voltage.

4. The display device of claim 3, wherein the resistors of the compensation units have different resistance values from each other, and the capacitors of the compensation units have different capacitances from each other.

5. The display device of claim 3, wherein the compensation circuit further comprises a switching circuit connected between the first end of the resistor of each of the compensation units and the first node, and wherein the switching circuit is operated in response to the compensation selection signal.

6. The display device of claim 3, wherein, when the pattern of the first image signals is a first pattern with a current consumption of a first level, the driving controller outputs the compensation selection signal to connect a first resistor having a largest resistance value among the resistors to the first node.

7. The display device of claim 6, wherein, when the pattern of the first image signals is a second pattern with a current consumption smaller than the first level, the driving controller outputs the compensation selection signal to connect a second resistor having a resistance value smaller than the first resistor to the first node.

8. The display device of claim 1, wherein the compensation units comprise a first compensation unit and a second compensation unit,
wherein the first compensation unit comprises:
a first resistor comprising a first resistance value; and
a first capacitor comprising a first capacitance and connected to the first resistor, and
wherein the second compensation unit comprises:
a second resistor comprising a second resistance value larger than the first resistance value; and
a second capacitor comprising a second capacitance smaller than the first capacitance and connected to the second resistor.

9. The display device of claim 8, wherein the driving controller outputs the compensation selection signal to select the first compensation unit when the pattern of the first image signals is a first pattern, and outputs the compensation selection signal to select the second compensation unit when the pattern of the first image signals is a second pattern having a current consumption larger than the first pattern.

10. The display device of claim 1, further comprising:
a display panel comprising a plurality of gate lines, a plurality of data lines, and a plurality of pixels connected to the gate lines and the data lines;
a gate driver configured to drive the gate lines; and
a data driver configured to receive the driving power voltage and drive the data lines.

11. A display device comprising:
a driving controller configured to sense a pattern of first image signals applied to the driving controller and generate a compensation selection signal corresponding to the sensed pattern;
a voltage generator configured to generate a driving power voltage in response to a feedback signal having a slew rate based on the compensation selection signal; and
a compensation circuit comprising a plurality of compensation units, wherein the compensation circuit is configured to electrically connect one compensation unit among the compensation units to a first node of the voltage generator in response to the compensation selection signal, the voltage generator comprising:
a power converter configured to generate the driving power voltage in response to a power control signal;
a comparator configured to compare the driving power voltage with a reference voltage and output a feedback signal to the first node; and
a power control circuit configured to generate the power control signal in response to the feedback signal.

12. The display device of claim 11, wherein each of the compensation units comprises:

a resistor comprising a first end and a second end; and
a capacitor connected between the second end of the resistor and a ground voltage.

13. The display device of claim 12, wherein the resistors of the compensation units have different resistance values from each other, and the capacitors of the compensation units have different capacitances from each other.

14. The display device of claim 13, wherein the compensation circuit further comprises a switching circuit connected between the first end of the resistor of each of the compensation units and the first node, wherein the switching circuit is operated in response to the compensation selection signal.

15. The display device of claim 13, wherein, when the pattern of the first image signals is a first pattern with a current consumption of a first level, the driving controller outputs the compensation selection signal to connect a first resistor having a largest resistance value among the resistors to the first node.

16. The display device of claim 15, wherein, when the pattern of the first image signals is a second pattern with a current consumption is smaller than the first level, the driving controller outputs the compensation selection signal to connect a second resistor having a resistance value smaller than the first resistor to the first node.

17. The display device of claim 11, wherein the compensation units comprise a first compensation unit and a second compensation unit, the first compensation unit comprises:
a first resistor comprising a first resistance value; and
a first capacitor comprising a first capacitance and connected to the first resistor in series, and the second compensation unit comprises:
a second resistor comprising a second resistance value larger than the first resistance value; and
a second capacitor comprising a second capacitance smaller than the first capacitance and connected to the second resistor in series.

18. The display device of claim 17, wherein the driving controller selects the first compensation unit when the pattern of the first image signals is a first pattern.

19. The display device of claim 18, wherein the driving controller selects the second compensation unit when the pattern of the first image signals is a second pattern having a current consumption larger than the first pattern.

20. The display device of claim 11, further comprising:
a display panel comprising a plurality of gate lines, a plurality of data lines, and a plurality of pixels connected to the gate lines and the data lines;
a gate driver configured to drive the gate lines; and
a data driver configured to receive the driving power voltage and drive the data lines.

21. A display device comprising:
a driving controller configured to sense a pattern of image signals and output a compensation selection signal corresponding to the sensed pattern; and
a voltage generator configured to generate a driving power voltage in response to the compensation selection signal, wherein the voltage generator is further configured to generate the driving power voltage in response to a feedback signal having a slew rate controlled by a compensation circuit selected by the compensation signal.

22. The display device of claim 21, wherein a ripple component of the driving power voltage is removed by a power control circuit that generates a power control signal in response to the feedback signal.

* * * * *